(12) United States Patent
Gollentz et al.

(10) Patent No.: US 9,054,574 B2
(45) Date of Patent: Jun. 9, 2015

(54) METHOD AND DEVICE FOR DETERMINING THE VALUE OF A CHARACTERISTIC QUANTITY OF A SYSTEM FOR POWERING A LOAD

(75) Inventors: Bernard Gollentz, Soultz (FR); Régis Peron, Belfort (FR); Daniel Girod, Cravanche (FR)

(73) Assignee: GE Energy Power Conversion Technology Ltd., Warwickshire (GB)

( * ) Notice: Subject to any disclaimer, the term of this patent is extended or adjusted under 35 U.S.C. 154(b) by 245 days.

(21) Appl. No.: 13/636,533

(22) PCT Filed: Mar. 23, 2011

(86) PCT No.: PCT/FR2011/050614
§ 371 (c)(1),
(2), (4) Date: Feb. 27, 2013

(87) PCT Pub. No.: WO2011/117537
PCT Pub. Date: Sep. 29, 2011

(65) Prior Publication Data
US 2013/0155744 A1 Jun. 20, 2013

(30) Foreign Application Priority Data
Mar. 23, 2010 (FR) .................................... 10 52076

(51) Int. Cl.
*H02J 1/10* (2006.01)
*H02M 7/04* (2006.01)
(Continued)

(52) U.S. Cl.
CPC ................. *H02M 7/04* (2013.01); *G01R 31/40* (2013.01); *H02J 7/34* (2013.01); *G06F 17/00* (2013.01)

(58) Field of Classification Search
USPC ........ 363/65, 67, 71, 84, 125; 307/36, 61, 63, 307/82, 86
See application file for complete search history.

(56) References Cited

U.S. PATENT DOCUMENTS 4,460,860 A * 7/1984 Schwesig et al. ............. 318/721
5,122,735 A * 6/1992 Porter et al. .................. 324/142
(Continued)

FOREIGN PATENT DOCUMENTS

EP 1868279 A1 12/2007

OTHER PUBLICATIONS

Bordry et al., "CERN-PS Main Power Converter Renovation: How to Provide and Control the Large Flow of Energy for a Rapid Cycling Machine", Proceedings of the 2005 Particle Accelerator Conference, May 16-20, 2005, pp. 3612-3614.

*Primary Examiner* — Timothy J Dole
*Assistant Examiner* — Yusef Ahmed
(74) *Attorney, Agent, or Firm* — Parks Wood LLC

(57) ABSTRACT

A method determines the value of a characteristic quantity (U1dc, U2dc) of a system for powering a load which includes M DC-DC converters, connected in series to the terminals of the load and at the output of a DC current power supply, and at least one storage capacitor and includes the measurement of a plurality of values of a first characteristic quantity (Ic) with a first high resolution, the measurement with a low resolution of a value of a second characteristic quantity (U1dc, U2dc), and a determination with a second high resolution of a value of the second characteristic quantity (U1dc, U2dc) from the plurality of values measured with the first high resolution of the first characteristic quantity (Ic) and from the value with the low resolution of the second characteristic quantity (U1dc, U2dc). The first and second high resolutions are at least 10 times greater than the low resolution.

13 Claims, 5 Drawing Sheets

Figure 1:
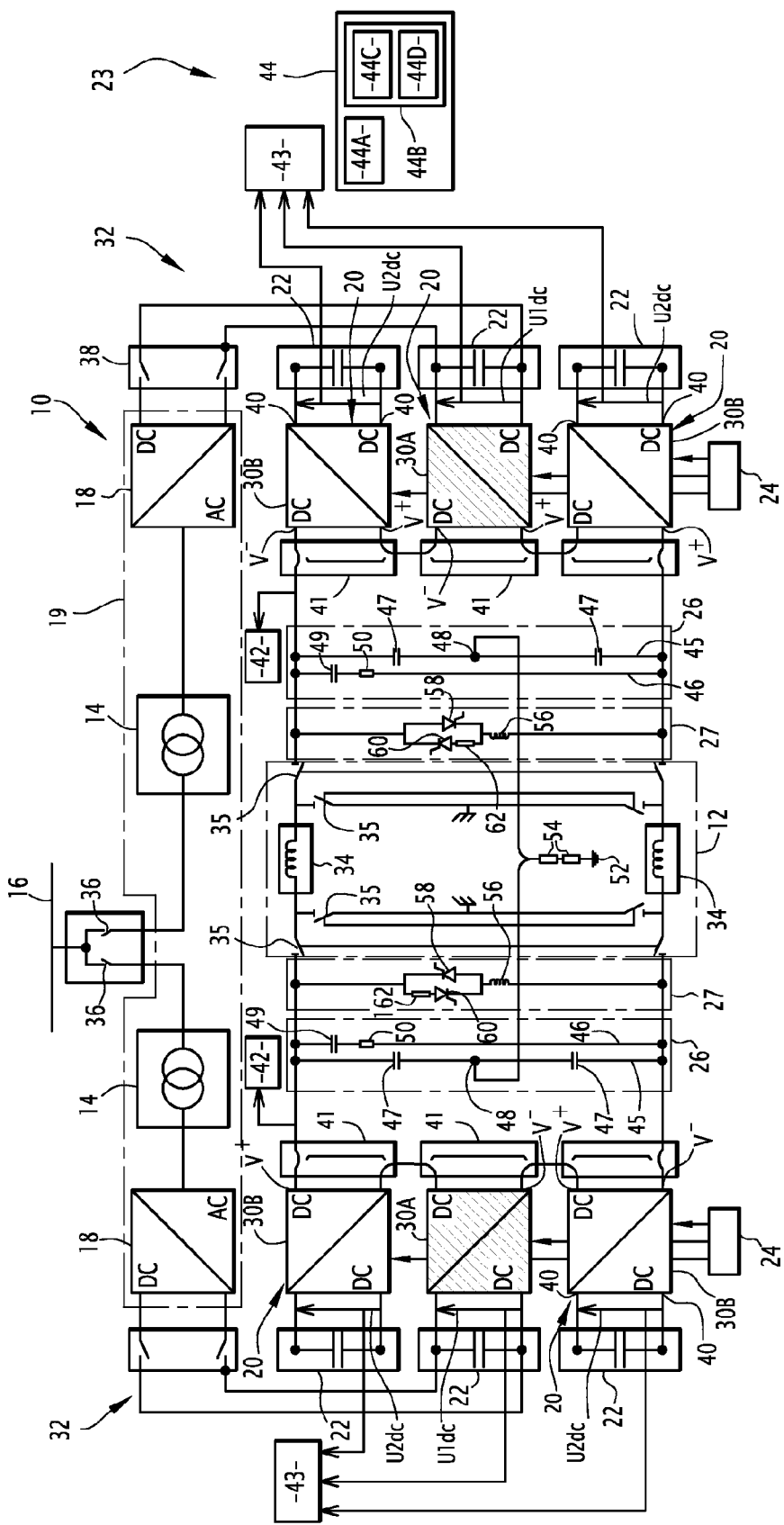

(51) Int. Cl.
  *G01R 31/40* (2014.01)
  *G06F 17/00* (2006.01)
  *H02J 7/34* (2006.01)

(56) References Cited

U.S. PATENT DOCUMENTS

| | | | |
|---|---|---|---|
| 5,459,432 A | * | 10/1995 | White et al. ............. 329/307 |
| 5,638,263 A | * | 6/1997 | Opal et al. ............. 363/65 |
| 2003/0184556 A1 | * | 10/2003 | Hollis et al. ............. 345/582 |
| 2003/0214824 A1 | * | 11/2003 | Corzine ............. 363/71 |
| 2004/0075600 A1 | * | 4/2004 | Vera et al. ............. 341/166 |
| 2009/0279331 A1 | * | 11/2009 | Young et al. ............. 363/84 |
| 2010/0007209 A1 | * | 1/2010 | Eppler et al. ............. 307/36 |
| 2010/0135049 A1 | * | 6/2010 | Radecker et al. ............. 363/21.03 |
| 2012/0013351 A1 | * | 1/2012 | Daniel et al. ............. 324/602 |
| 2012/0078554 A1 | * | 3/2012 | Gagnon et al. ............. 702/64 |
| 2013/0021021 A1 | * | 1/2013 | Ramirez ............. 324/142 |

* cited by examiner

METHOD AND DEVICE FOR DETERMINING THE VALUE OF A CHARACTERISTIC QUANTITY OF A SYSTEM FOR POWERING A LOAD

CROSS-REFERENCE TO RELATED APPLICATIONS

This application is a National Stage application of International Patent Application No. PCT/FR2011/050614, filed on Mar. 23, 2011, which is incorporated by reference herein in its entirety, which claims the benefit of French Application No. 10 52076 filed Mar. 23, 2010, which is incorporated by reference herein in its entirety.

The present invention relates to a method for determining the value of a characteristic quantity of a system for powering a load, the system comprising M converter(s) of a DC current into another DC current, connected in series to the terminals of the load on one hand and to the output of a DC current power supply on the other hand, M being greater than or equal to 1, and at least one storage capacitor mounted in parallel of the converter(s) on the side opposite to the load.

The present invention also relates to a device for determining the value of such a characteristic quantity.

The present invention also relates to a power supply system for powering a load, the system including such a determination device.

In particular, the invention applies to a high power supply system, typically of the order of 50 MW. Such a power supply system is typically intended to power a load requiring that it be powered by a pulsed power supply such as a coil for guiding a proton synchrotron for example.

A determination method and a determination device of the aforementioned types are described in document EP 1 868 279 A1. The voltages on the terminals of each converter on the side of the storage capacitor are measured by a measuring instrument. The resolution of the values of these voltages therefore directly depends on the resolution of the measuring instrument, the resolution being the smallest change in measurement that the measuring instrument is capable of detecting. In other words, the resolution is the number of different values that the measuring instrument is capable of delivering for a given measurement interval. The determination of values of these voltages with a high resolution then requires that the measuring instrument have high resolution.

The object of the invention is to propose a method for determining a value, with high resolution, of a characteristic quantity not requiring direct measurement of the value of this characteristic quantity with a high resolution measurement instrument.

For this purpose, the subject-matter of the invention is a determination method of the aforementioned type, characterized in that it comprises the following steps:
- measuring a plurality of values of a first characteristic quantity, with a first high resolution,
- measuring a value of a second characteristic quantity with a low resolution, and
- determining a value of a second characteristic quantity with a second high resolution from the plurality of measured values of the first characteristic quantity with the first high resolution and from the value of the second characteristic quantity with the low resolution, the first and second high resolutions being at least 10 times greater than the low resolution.

According to other embodiments, the determination method comprises one or more of the following features, taken individually or according to all technically possible combinations:
- determination of the value of the second characteristic quantity with the second high resolution includes a plurality of iterations, a next value of the second characteristic quantity being calculated, at each iteration, from a previous value of the second characteristic quantity and a corrective term depending on the measured value at each iteration of the first characteristic quantity with the first high resolution, the initial value of the second characteristic quantity being equal to the value of the second characteristic quantity with low resolution,
- the first characteristic quantity is the intensity of the current delivered to the load and the second characteristic quantity is the voltage on the terminals of the converter on the side of the storage capacitor,
- each of the M converter(s) is connected at the output of the DC current power supply and the next value U1dc(n) of the voltage on the terminals of the converter on the side of the storage capacitor is determined from the previous value U1dc(n−1) according to the following equation:

$$U1\text{dc}(n) = U1\text{dc}(n-1) + \frac{h(Ic)}{U1\text{dc}(n-1)},$$

wherein h(Ic) represents a term depending on the intensity of the current delivered to the load.
- M is strictly greater than 1 and the plurality of M converter(s) consists of N1 first converter(s) connected at the output of the DC current power supply, N1 being greater than or equal to 1, and N2 second converter(s) which are connected at the output of said power supply, N2 being greater than or equal to 1, the sum of N1 and N2 being equal to
- the second characteristic quantity is the voltage on the terminals of each first converter on the side of the associated storage capacitor and the next value U1dc(n) of said voltage on the terminals of the first converter is calculated from the previous value U1dc(n−1) of the voltage on the terminals of the first converter according to the following equation:

$$U1\text{dc}(n) = U1\text{dc}(n-1) + \frac{f(Ic)}{U1\text{dc}(n-1)}$$

wherein f(Ic) represents a term depending on the intensity of the current delivered to the load,
- the second characteristic quantity is the voltage on the terminals of each second converter on the side of the storage capacitor, and wherein the next value U2dc(n) of said voltage on the terminals of the second converter is calculated from the previous value U2dc(n−1) of said voltage on the terminals of the second converter according to the following equation:

$$U2\text{dc}(n) = U2\text{dc}(n-1) + \frac{g(Ic)}{U2\text{dc}(n-1)}$$

wherein g(Ic) represents a term depending on the intensity of the current delivered to the load, the first and second high resolutions each include between 17 and 32 bits, the low resolution includes between 5 and 15 bits, preferably 11 bits, and the period between two iterations is equal to 1 ms.

The object of the invention is also a device for determining a characteristic quantity of a system for powering a load, comprising M converter(s) of a DC current into another DC current, connected in series to the terminals of the load, M being greater than or equal to 1, and at least one storage capacitor mounted in parallel of the converter(s) on the side opposite to the load, characterized in that it comprises:

means for measuring a plurality of values of a first characteristic quantity with a first high resolution, means for measuring a value of a second characteristic quantity with low resolution, and means for determining a value of the second characteristic quantity with a second high resolution from the plurality of values of the first characteristic quantity, measured with the first high resolution, and from the value of the second characteristic quantity with low resolution, the first and second high resolutions being at least 10 times greater than the low resolution.

The subject-matter of the invention is also a power supply system for powering a load, comprising:

a DC current supply connected to an electric network,

M converter(s) of a DC current into another DC current connected in series to the terminals of the load, M being greater than or equal to 1, at least one storage capacitor mounted in parallel of the converter(s) on the side opposite to the load, and a device for determining the value of a characteristic quantity of the power supply system, characterized in that the determination device is as defined above.

According to other embodiments, the power supply system comprises one or more of the following features, taken individually or according to all technically possible combinations wherein:

the DC current power supply comprises at least one AC voltage transformer connected to the electric network and at least one voltage rectifier connected at the output of the voltage transformer, each of the M converter(s) is connected at the output of the DC current power supply, M is strictly greater than 1 and the plurality of M converters consists of N1 converter(s) connected at the output of the DC current power supply, N1 being greater than 1 or equal to 1, and N2 second converter(s) which are not connected at the output of said power supply, N2 being greater than or equal to 1, the sum of N1 and N2 being equal to M.

Figure 2:
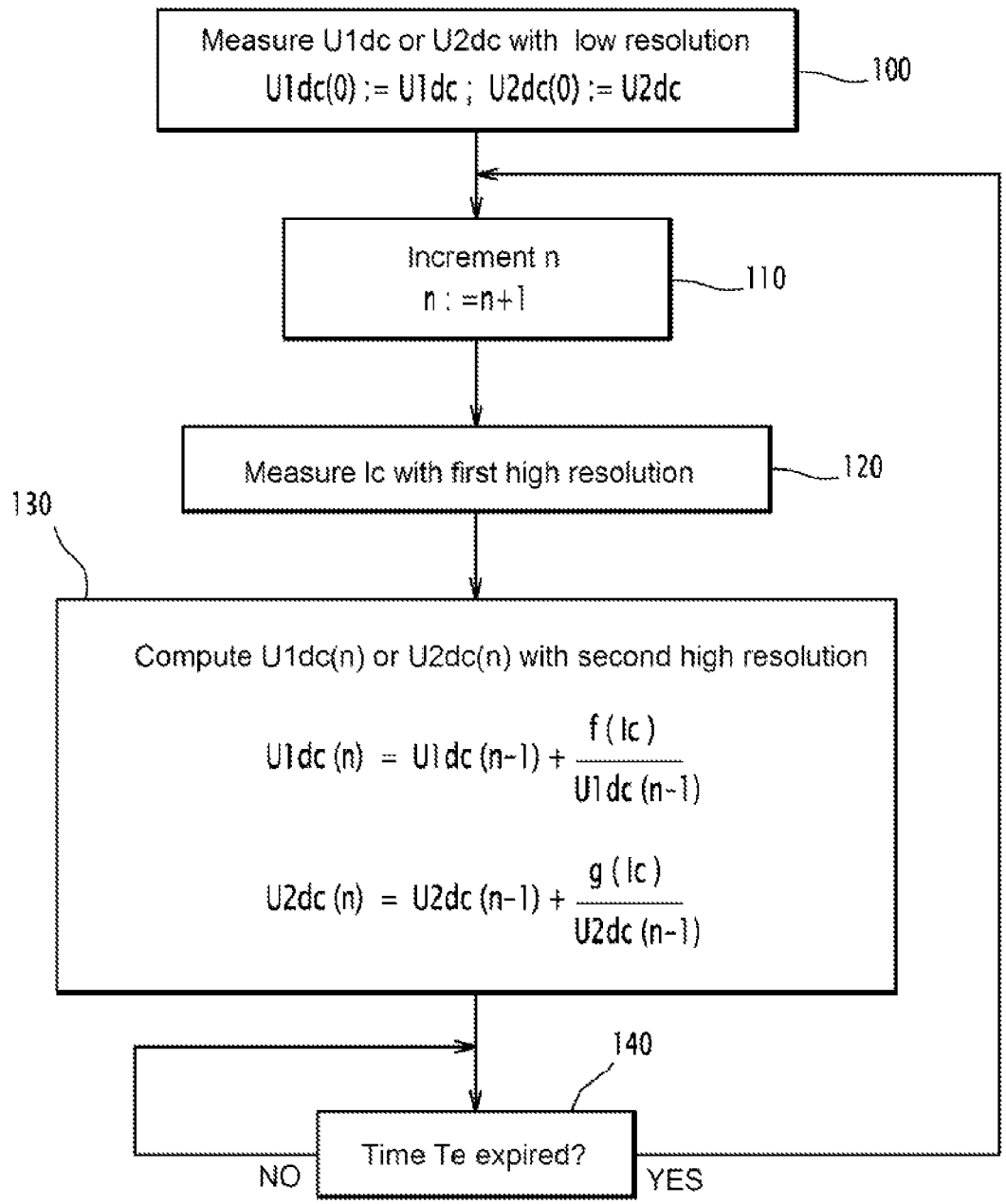
Figure 3:
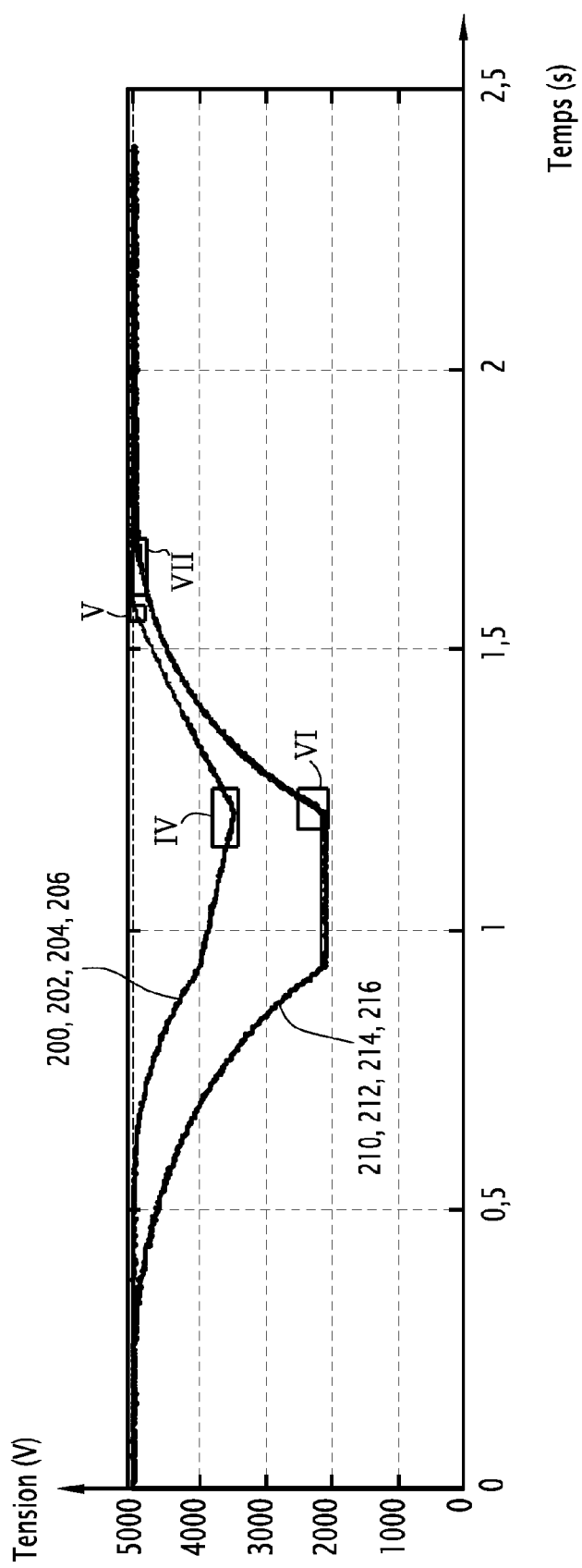
Figure 4:
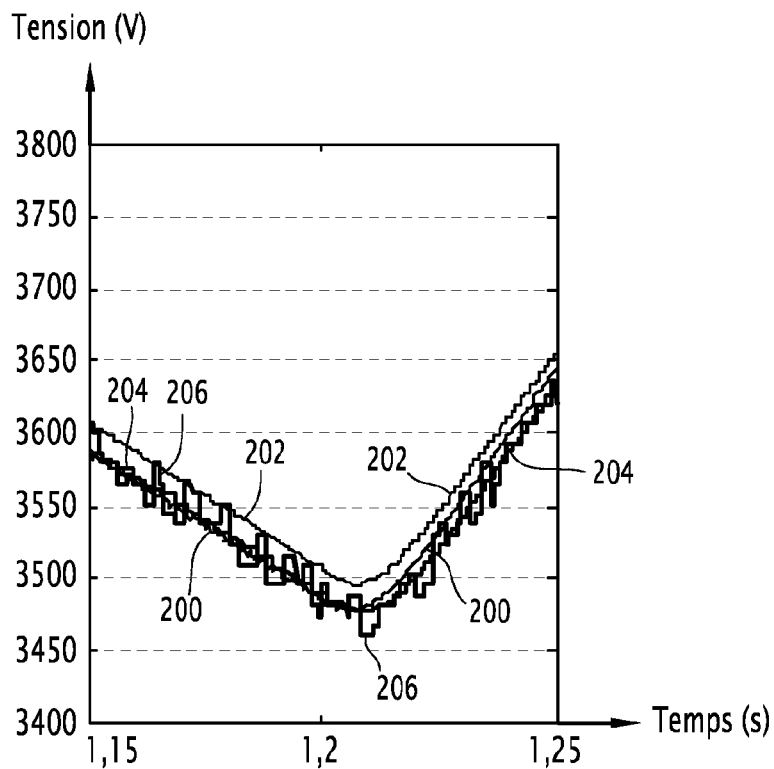
Figure 5:
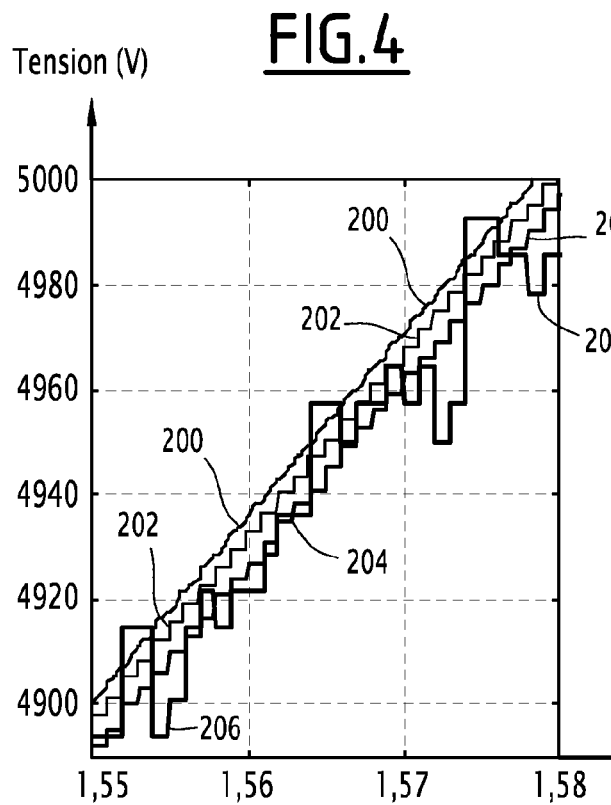
Figure 6:
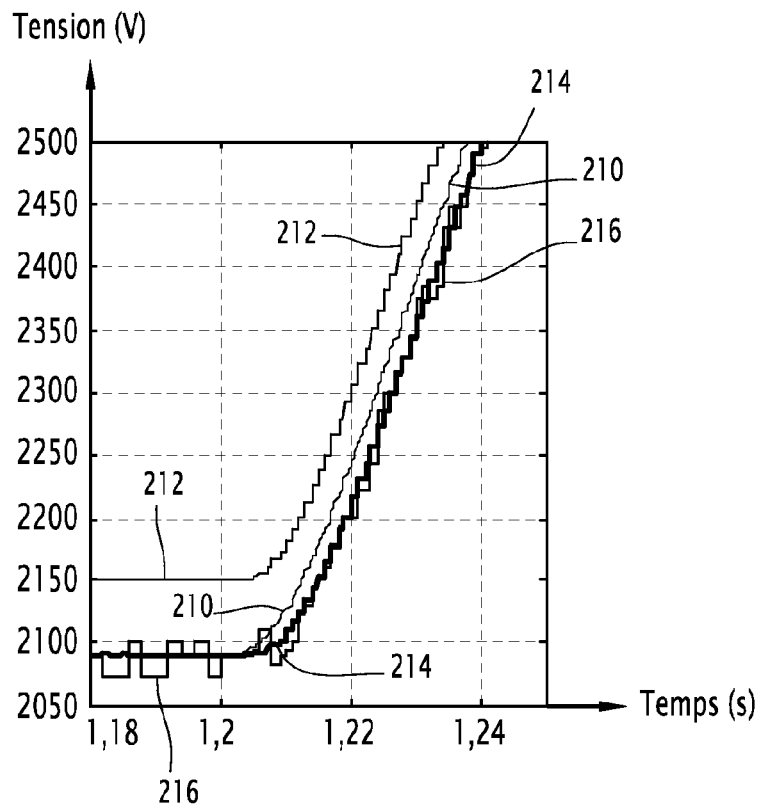
Figure 7:
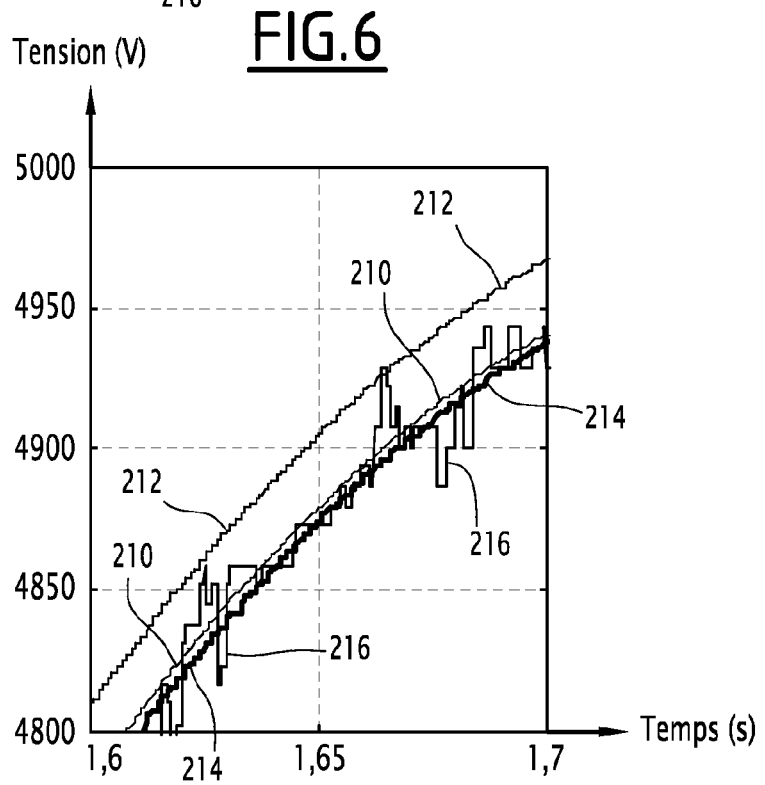

These features and advantages of the invention will become apparent upon reading the description which follows, only given as an example, and made with reference to the appended drawings, wherein:

FIG. 1 is a schematic illustration of a power supply system according to the invention including six converters of a DC current into another DC current, FIG. 2 is a flow chart of the determination method according to the invention, FIG. 3 is a set of curves illustrating versus time the voltages on the terminals of a first converter, and of a second converter respectively, and FIGS. 4, 5, 6 and 7 are enlargements of the framed areas IV, V, VI and VII of FIG. 3, respectively.

In FIG. 1, a power supply system 10 for supplying power to a load 12 comprises two AC voltage transformers 14 connected to an electric network 16 and two voltage rectifiers 18, each being connected at the output of a voltage transformer 14. The voltage transformers 14 and the voltage rectifiers 18 form a DC current power supply 19 connected to the electric network 16. The DC current power supply 19 is able to deliver an electric power P supply with a maximum value equal to 12.5 MW.

The power supply system 10 also includes M converters 20 of a DC current into another DC current and M storage capacitors 22, each being mounted in parallel, of a respective converter 20. The M converters 20 are connected in series to the terminals of the load 12. M is greater than or equal to 1.

The power supply system 10 also includes a device 23 for determining the value of the voltage on the terminals of the respective converters 20 on the side of the storage capacitor 22, means 24 for controlling the converters 20, two filters 26 connected between the load 12 and the converters 20 and two devices 27 for discharging the load 12 if the latter is faulty.

In the exemplary embodiment of FIG. 1, the M converters consist of N1 first converters 30A, so-called load converters, connected at the output of a respective rectifier 18 and of N2 second converters 30B, so-called floating converters. The N2 floating converters 30B are not directly connected at the output of the rectifiers. N1 and N2 are greater than or equal to 1. The sum of N1 and N2 is equal to M.

In the exemplary embodiment of FIG. 1, M is an even number greater than or equal to 4, for example equal to 6. N1 is equal to 2 and N2 is equal to 4.

In an alternative not shown, the M converters are connected in series to the terminals of the load on the one hand and to the output of the DC current power supply on the other hand. In other words, the M converters are load converters connected at the output of a respective rectifier, and N1 is equal to M. Each load converter has a voltage U1dc on its terminals on the side of the associated storage capacitor.

The load 12 includes a coil for guiding a proton synchrotron separated into two half coils 34, and relays 35 for insulating the half coils 34. The load 12 has an inductance Lc, for example equal to 9 mH, an internal resistance Rc, for example equal to 3.2 mΩ, a capacity Cc, for example equal to 22 nF, and a damping resistor pc, equal to 136Ω.

The current delivered to the load 12 by the converters 20 has an intensity Ic, and the voltage on the terminals of the load 12 includes a resistive component $V_R$ and an inductive component $V_L$.

Each AC voltage transformer 14 is connected to the electric network 16 via a first relay 36.

The electric network 16 is a multiphase AC network capable of delivering a current including a plurality of phases to the power supply system 10. The electric network 16 is for example a three-phase network.

Each rectifier 18 is a converter of an input AC current into an output DC current, and is connected at the output of the first corresponding converter 30A via second relays 38 capable of insulating the first converter 30A from its respective rectifier 18 if need be.

All the converters 20 are identical in their structure, only their control law being specific to each of them.

Each converter 20 of a DC current into another DC current, also called a chopper, includes two terminals 40 connected to the respective storage capacitor 22 and two second terminals V+, V−. Each terminal V+ of a chopper 20 is connected to the terminal V− of an adjacent chopper 20, the choppers 20 being connected in series to the terminals of the load 12. Both second terminals V+, V− positioned at the ends of the choppers 20 in series, and not connected to a second corresponding terminal of another chopper, are connected to the terminals of the load 12.

Each load converter 30A has a voltage U1dc between its terminals 40 on the side of the associated storage capacitor, and each floating converter 30B has a voltage U2dc between its terminals 40 on the side of the associated storage capacitor.

Each chopper 20 is able to vary the voltage of the current flowing through the second terminals V+, V− with respect to the current flowing through the first terminals 40. Each chopper 20 is reversible, the current being able to flow from the corresponding capacitor 22 to the load 12 during a time interval and of flowing in the reverse direction from the load 12 to the capacitor 22 during another time interval.

Each chopper 20 includes two modules, not shown, forming an H-shaped bridge. Each module is connected between the first two terminals 40 on the one hand and a respective terminal V+, V− on the other hand. Each module comprises one or more switching branches, preferably identical. Each switching branch for example forms a three-level voltage inverter. Alternatively, each switching branch forms a two-level voltage inverter.

All the storage capacitors 22 are identical in their structure, and each have a capacitance C.

The power supply system 10 also includes M controllable shunts 41, each being arranged in parallel on the second terminals V+, V− of a respective chopper. Each shunt 41 is able, when it is controlled, to short circuit both second terminals V+, V− of the corresponding chopper.

The determination device 23 comprises means 42 for measuring with a first high resolution, a plurality of successive values of an intensity Ic of the current delivered to the load 12, means 43 for measuring with low resolution a value of the voltage U1dc, U2dc on the terminals of the converter 20 on the storage capacitor side. The determination device 23 also comprises means 44 for determining a value of the voltage U1dc, U2dc with a second high resolution from the plurality of values of the intensity Ic of the current delivered to the load measured with the first high resolution and from the value with low resolution of the voltage U1dc, U2dc on the terminals of the converter on the storage capacitor side.

The first and second high resolutions include, for example between 17 and 32 bits. The first high resolution and the second high resolution preferably include 32 bits. In other words, the determination means 44 are for example capable of determining a value of the voltage U1dc, U2dc from $2^{32}$ values, i.e. 4,294,967,296 different values, for a given measurement interval. For measuring a voltage between 0 and 10 kV, the smallest measurement variation capable of being determined by the determination means 44 is then equal to 10 kV/$2^{32}$, i.e. about 2.3 µV.

The low resolution for example includes between 5 and 15 bits, preferably 11 bits. In other words, the measuring means 43 are for example capable of measuring a value of the voltage U1dc, U2dc from $2^{11}$ different values i.e. 2,048 different values, for a given measurement interval.

The first and second high resolutions are at least 10 times greater than the low resolution. The second high resolution including $2^{32}$ different values for a given measurement interval is for example $2^{21}$ times, i.e. 2,097,152 times, greater than the low resolution including $2^{11}$ different values for the measurement interval. The first high resolution is for example and similarly, $2^{21}$ times, 2,097,152 times greater than the lowest resolution.

The measurement means 42 for example include an amperemeter capable of measuring an intensity of the current with the first high resolution.

The measurement means 43 include a low resolution voltage sensor.

The determination means 44 are connected to the measurement means 42, 43. The determination means 44 include an information processing unit for example formed with a data processor 44A associated with a memory 44B. The memory 44B is able to store a software package 44C for acquiring values measured by the measuring means 42, 43 and a software package 44D for determining a value with the second high resolution of the voltage U1dc, U2dc from the plurality of values measured with the first high resolution by the measurement means 42 and from the value with the low resolution measured by the measurement means 43.

Alternatively, the determination means 44 are made as programmable logic components, or further as dedicated integrated circuits.

Each filter 26 is laid out between the load 12 and a set of respective converters 28 and includes a first branch 45 and a second branch 46, both branches 45, 46 being parallel with each other. The first branch 45 comprises two capacitors 47 connected in series between the terminals of the load 12, both capacitors 47 being connected together in a middle point 48. The second branch 46 comprises a capacitor 49 and a resistor 50 connected in series between the terminals of the load 12. The middle points 48 of each of the first branches 45 of the filters are connected together and connected to an electric ground 52 via resistors 54.

The discharge device 27 is connected in parallel on the load 12 between its respective terminals. The discharge device 27 includes a coil 56 connected in series to a set of components including a first thyristor 58 connected in parallel with a second thyristor 60 and a discharge resistor 62 connected in series. The first 58 and second 60 thyristors are connected head-to-tail.

FIG. 2 illustrates a method for determining the value of the voltage U1dc, U2dc on the terminals of the converter 20 on the side of the associated storage capacitor 22.

In step 100, the measurement means 43 measure a single value with low resolution of the voltage U1dc, U2dc on the terminals of the converter 20 on the side of the associated storage capacitor.

The determination of the value for the second high resolution of the voltage U1dc, U2dc, for example includes a plurality of iterations. A next value U1dc(n), U2dc(n) of the voltage on the terminals of the converter is calculated, at each iteration from a previous value U1dc(n−1), U2dc(n−1) of the voltage on the terminals of the converter and from a corrective term.

The initial value U1dc(0), U2dc(0) of the voltage on the terminals of the converter is equal to the value, during step 100, measured with low resolution of the voltage U1dc, U2dc on the terminals of the converter.

n represents an iteration index. The value of the index n is incremented by one unit in step 110.

The corrective term depends on the value measured with the first high resolution of the intensity Ic of the current delivered to the load. This value of the intensity Ic is measured at each iteration during step 120 by the measurement means 42. The measurement means 42 thus measure during the application of the determination method, with the first high resolution, a plurality of successive values of the intensity Ic of the current delivered to the load 12.

The determination means 44 then calculate in step 130 the next value U1dc(n), U2dc(n) of the voltage on the terminals of the converter from the value measured with the first high resolution, of the intensity Ic of the current delivered to the load (step 120) and from the value with low resolution of the voltage U1dc, U2dc on the terminals of the converter (step 100).

When the sampling period Te has expired at the end of step 140, the determination method is iterated by returning to step 110.

The determination method includes as many iterations as required so that the value of the second high resolution is at least 10 times greater than that of the low resolution. The minimum number N of iterations is for example greater than 50, preferably greater than 80, still preferably equal to 100.

The determination means 44 thereby determine in step 130 of the $N^{th}$ iteration, a value with the second high resolution, of the voltage U1dc, U2dc on the terminals of the converter 20 from the plurality of successive values measured with the first high resolution of the intensity Ic of the current delivered to the load and from the value with low resolution, of the voltage U1dc, U2dc on the terminals of the converter.

The resistive component $V_R$ of the voltage on the terminals of the load is for example only provided by the load converters 30A. The inductive component $V_L$ of the voltage on the terminals of the load is, as for it, delivered both by the load converters 30A and by the floating converters 30B.

The distribution of the inductive component $V_L$ among the converters 30A and the floating converters 30B is defined by distribution coefficients between the converters of the inductive component $V_L$, i.e. a first distribution coefficient K1 associated with the load converters 30A and a second distribution coefficient K2 associated with the floating converters 30B. The distribution coefficients K1, K2 have respective predetermined values. The inductive component $V_L$ is, for example delivered for a great part by the floating converters 30B, and the predetermined value of K2 is then greater than that of K1.

The first and second distribution coefficients K1, K2 verify the following equation:

$$N1 \times K1 + N2 \times K2 = 1 \quad (1)$$

When the determined voltage is the voltage U1dc on the terminals of each of the N1 load converters 30A, the next value U1dc(n) of said voltage is calculated from the previous value U1dc (n−1) of said voltage according to the following equation:

$$U1\mathrm{dc}(n) = U1\mathrm{dc}(n-1) + \frac{f(Ic)}{U1\mathrm{dc}(n-1)} \quad (2)$$

Wherein f(Ic) represents a term depending on the intensity Ic of the current delivered to the load.

The function f is for example determined by means of the following equation:

$$f(Ic) = \frac{1}{C} \times \left( \frac{1}{N1} (P_{supply} - V_R \cdot Ic) - K1 \cdot V_L \cdot Ic \right) \times T_e, \quad (3)$$

wherein $T_e$ represents the period between two iterations.

When the determined voltage is the voltage U2dc on the terminals of each of the N2 floating converters 30B, the next value U2dc(n) of said voltage is calculated from the previous value U2dc(n−1) of said voltage according to the following equation:

$$U2\mathrm{dc}(n) = U2\mathrm{dc}(n-1) + \frac{g(Ic)}{U2\mathrm{dc}(n-1)} \quad (4)$$

wherein g(Ic) represents a term depending on the intensity Ic of the current delivered to the load.

The g function is for example determined by means of the following equation:

$$g(Ic) = -\frac{K2}{C} \times (V_L \cdot Ic) \times T_e. \quad (5)$$

Alternatively, when each of the converters is connected at the output of the DC current power supply, the determined voltage is the voltage U1dc on the terminals of each of the load converters. The next value U1dc(n) of the voltage on the terminals of the load converter on the side of the storage capacitor is then determined from the previous value U1dc (n−1) of said voltage according to the following equation:

$$U1\mathrm{dc}(n) = U1\mathrm{dc}(n-1) + \frac{h(Ic)}{U1\mathrm{dc}(n-1)} \quad (6)$$

wherein h(Ic) represents a term depending on the intensity Ic of the current delivered to the load.

The function h is for example determined by means of the following equation:

$$h(Ic) = \frac{1}{C} \times \left( \frac{1}{M} (P_{supply} - V_R \cdot Ic) - V_L \cdot Ic \right) \times T_e. \quad (7)$$

FIG. 3 illustrates curves representing the different measured and determined voltages as well as simulated voltages as a comparison, for the load converters 30A and for the floating converters 30B. FIGS. 4 to 7 illustrate enlargements of the areas IV to VII of FIG. 3.

The curves 200, 202, 204 and 206 are curves of voltage on the terminals of the load converters 30A on the side of the associated storage capacitor.

The curves 210, 212, 214 and 216 are the curves of voltage on the terminals of the floating converters 30B on the side of the respective storage capacitor.

Curves 200 and 210 illustrate voltages which were simulated according to electric laws, in order to represent the voltages on the terminals of the load converters and on the terminals of the floating converters without any error of approximation, such as a measurement error, a calculation error or further an error due to the resolution.

Curves 202 and 212 show the voltages, respectively on the terminals of the load converters 30A and on the terminals of the floating converters 30B, determined with the second high resolution by the determination means 44. In the exemplary embodiment of FIGS. 3 to 7, the second high resolution includes 32 bits.

Curves 204 and 214 illustrate voltages on the terminals of the load converters and on the terminals of the floating converters simulated with the second high resolution. In other words, curves 204 and 214 are simulated curves corresponding to the curves 202 and 212. The shift between the curves 202 and 204, 212 and 214 respectively is related to the fact that the determination device 23 does not take into account the losses related to the converters 20.

Curves 206 and 216 finally show the voltages, notably on the terminals of the load converters 30A and on the terminals of the floating converters 30B, measured with low resolution by measurement means 43. In the exemplary embodiment of FIGS. 3 to 7, the low resolution includes 11 bits.

Curves 202, 204, 206, 212, 214 and 216 each have a staged shape including horizontal plateaus and vertical portions. The horizontal plateaus correspond to the sampling period Te and the vertical portions depend on the resolution.

In the exemplary embodiments of FIGS. 3 to 7, the sampling period Te is identical and equal to 1 ms for all the curves 202, 204, 206, 212, 214, 216, so that all the horizontal plateaus of these curves have same length. It is also seen that curves 202 and 204, 212 and 214 respectively, illustrate the second high resolution with vertical portions of small height, while curves 206 and 216 illustrate the low resolution with vertical portions of large height.

It is thus conceivable that the method and the device according to the invention allow determination with high resolution of a value of the voltage on the terminals of the converter on the side of the storage capacitor, while not requiring any measurement of this voltage with a high resolution measurement instrument.

Alternatively, the determination method comprises the measurement of a plurality of values, with the first high resolution, of the voltage U1dc, U2c, on the terminals of the converter on the side of the storage capacitor and the measurement with low resolution of a value of the intensity Ic of the current delivered to the load. The determination method then comprises the determination of a value, with the second high resolution, of the intensity Ic of the current delivered to the load from the plurality of values measured with the first high resolution of the voltage U1dc, U2dc on the terminals of the converter on the side of the storage capacitor and from the value with low resolution of the intensity Ic of the current delivered to the load.

The invention claimed is:

1. A method for determining the value of a characteristic quantity (U1dc, U2dc) of a system for powering a load including M converter(s) of a DC current into another DC current, connected in series to the terminals of the load and to an output of a DC power supply, M being greater than or equal to 1, and at least one storage capacitor mounted in parallel with the converter(s) on an side opposite of the load, the method comprising:

measuring, in a measurement device, a plurality of values of a first characteristic quantity (Ic), with a first high resolution value range, measuring, in the measurement device, a value of a second characteristic quantity (U1dc, U2dc), with a low resolution value range, and determining with a second high resolution value range a value of the second characteristic quantity (U1dc, U2dc) from the plurality of values measured with the first high resolution value range of the first characteristic quantity (Ic) and from the value of the second characteristic quantity (U1dc, U2dc) with the low resolution value range, the first and second high-resolution value ranges being at least 10 times greater than the low resolution value range, the first and second high resolution value ranges each including between 17 and 32 bits, and the low resolution value range including between 5 and 15 bits.

2. The method according to claim 1, wherein the determination with the second high resolution value range of the value of the second characteristic quantity includes a plurality of iterations, a next value (U1dc(n), U2dc(n)) of the second characteristic quantity being calculated at each iteration from a previous value (U1dc(n−1), U2dc(n−1)) of the second characteristic quantity and from a corrective term depending on the value, at each iteration, measured with the first high resolution value range of the first characteristic quantity (Ic), the initial value (U1dc(0), U2dc(0)) of the second characteristic quantity being equal to the value with low resolution value range of the second characteristic quantity (U1dc, U2dc).

3. The method according to claim 2, wherein each of the M converter(s) is connected at the output of the DC current power supply and in which the next value (U1dc(n)) of the voltage on the terminals of the converter on the side of the storage capacitor is determined from the previous value U1dc (n−1)) according to the following equation:

$$U1dc(n)=U1dc(n-1)+h(Ic)/U1dc(n-1)$$

wherein h(Ic) represents a term depending on the intensity of the current delivered to the load.

4. The method according to claim 2 wherein the second characteristic quantity is the voltage (U1dc) on the terminals of each first converter on the side of the associated storage capacitor, and wherein the next value (U1dc(n)) of said voltage on the terminals of the first converter is calculated from the previous value (U1dc(n−1)) of the voltage on the terminals of the first converter according to the following equation:

$$U1dc(n)=U1dc(n-1)+f(Ic)/U1dc(n-1)$$

wherein f(Ic) represents a term depending on the intensity of the current delivered to the load.

5. The method according to claim 2 wherein the second characteristic quantity is the voltage (U2dc) on the terminals of each second converter on the side of the storage capacitor, and in which the next value (U2dc(n)) of said voltage on the terminals of the second converter is calculated from the previous value (U2dc(n−1)) of said voltage on the terminals of the second converter according to the following equation:

$$U2dc(n)=U2dc(n-1)+g(Ic)/U2dc(n-1)$$

wherein g(Ic) represents a term depending on the intensity of the current delivered to the load.

6. The method according to claim 2, wherein a period ($T_e$) between two iterations is equal to 1 ms.

7. The method according to claim 1, wherein the first characteristic quantity is the intensity (Ic) of the current delivered to the load and in which the second characteristic quantity is the voltage (U1dc, U2dc) on the terminals of the converter on the side of the storage capacitor.

8. The method according to claim 1 wherein M is strictly greater than 1 and wherein the plurality of M converters consists of N1 first converters at the output of the DC current power supply, N1 being greater than or equal to 1, and N2 second converter(s) which are not connected at the output of said power supply, N2 being greater than or equal to 1, the sum of N1 and N2 being equal to M.

9. A device for determining a characteristic quantity (U1dc, U2dc) of a system for powering a load comprising M converter(s) of a DC current into another DC current, connected in series to the terminals of the load, M being greater than or equal to 1, and at least one storage capacitor mounted in parallel of the converter(s) on the side opposite to the load, characterized in that it comprises:

means for measuring a plurality of values of a first characteristic quantity (Ic), with a first high resolution value range, means for measuring a value of a second characteristic quantity (U1dc, U2dc) with a low resolution value range, and means for determining with a second high resolution value range a value of the second characteristic quantity (U1dc, U2dc) from the plurality of values measured with the first high resolution value range of the first characteristic quantity (Ic) and from the value with the low resolution value range of the second characteristic quantity (U1dc, U2dc), the first and second high resolution value ranges being at least 10 times greater than the low resolution value range, the first and second high resolution value ranges each including between 17 and 32 bits, and the low resolution value range including between 5 and 15 bits.

10. A power supply system for powering a load, comprising:
- a DC current power supply connected to an electric network,
- M converter(s) of a DC current into another DC current, connected in series to the terminals of the load, M being greater than or equal to 1,
- at least one storage capacitor mounted in parallel of the converter(s) on the opposite side to the load, and
- a determination device for determining the value of a characteristic quantity of the power supply system, wherein the determination device comprises:
- means for measuring a plurality of values of a first characteristic quantity (Ic), with a first high resolution value range,
- means for measuring a value of a second characteristic quantity (U1dc, U2dc) with a low resolution value range, and
- means for determining with a second high resolution value range a value of the second characteristic quantity (U1dc, U2dc) from the plurality of values measured with the first high resolution value range of the first characteristic quantity (Ic) and from the value with the low resolution value range of the second characteristic quantity (U1dc, U2dc), the first and second high resolution value ranges being at least 10 times greater than the low resolution value range, the first and second relative high resolution value ranges each including between 17 and 32 bits, and the low resolution value range including between 5 and 15 bits.

11. The system according to claim 10, wherein the DC current power supply comprises at least one AC voltage transformer connected to the electric network and at least one voltage rectifier connected at the output of the voltage transformer.

12. The system according to claim 10, wherein each of the M converters is connected at the output of the DC current power supply.

13. The system according to claim 10, wherein M is strictly greater than 1, and wherein the plurality of M converters consists of N1 first converters connected at the output of the DC current power supply, N1 being greater than or equal to 1, and N2 second converters which are not connected at the output of said power supply, N2 being greater than or equal to 1, the sum of N1 and N2 being equal to M.

* * * * *